(12) United States Patent
Potok et al.

(10) Patent No.: US 7,847,575 B2
(45) Date of Patent: Dec. 7, 2010

(54) METHOD AND APPARATUS FOR NANO PROBING A SEMICONDUCTOR CHIP

(75) Inventors: Ronald M. Potok, Austin, TX (US); Gregory A. Dabney, Austin, TX (US); Abdullah M. Yassine, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 162 days.

(21) Appl. No.: 12/180,989

(22) Filed: Jul. 28, 2008

(65) Prior Publication Data

US 2010/0019786 A1  Jan. 28, 2010

(51) Int. Cl.
 *G01R 31/26* (2006.01)
(52) U.S. Cl. .................................. 324/765; 324/754
(58) Field of Classification Search ......... 324/754–765, 324/555; 977/874–876, 947
See application file for complete search history.

(56) References Cited

U.S. PATENT DOCUMENTS

| | | | | |
|---|---|---|---|---|
| 6,208,375 B1 * | 3/2001 | Kay et al. | ...................... | 348/95 |
| 6,366,103 B1 * | 4/2002 | Cheng | ......................... | 324/754 |
| 6,746,144 B1 * | 6/2004 | Arafune et al. | .............. | 362/554 |
| 6,833,719 B2 * | 12/2004 | Hasegawa et al. | ........... | 324/762 |
| 6,836,132 B1 * | 12/2004 | Bruce et al. | ................. | 324/765 |
| 6,957,005 B2 * | 10/2005 | Saulnier et al. | ............. | 385/137 |
| 7,015,711 B2 * | 3/2006 | Rothaug et al. | ............. | 324/758 |
| 7,463,042 B2 * | 12/2008 | Pereira | ........................ | 324/754 |
| 7,675,300 B2 * | 3/2010 | Baur et al. | ................... | 324/751 |
| 2007/0222456 A1 * | 9/2007 | Kaszuba et al. | ............. | 324/555 |

OTHER PUBLICATIONS

*Introduction to NSOM*; Physics@ncsu-The Optics Laboratory; http://www.physics.ncsu.edu/optics/nsom/NSOMintro.html; Sep. 27, 2000; pp. 1-12.
*Near-field scanning optical microscope*; Wikipedia; http://en.wipipedia.org/wiki/Near-field_scanning_optical_microscope; Jan. 14, 2008; pp. 1-5.
*Near-field Scanning Optical Microscopy (NSOM)*; NanoScience Instruments; http://www.nanoscience.com/education/NSOM.html; 2008; p. 1.
*Zyvex nProber™-The Complete Solution for the Semiconductor Failure Analysis Industry*; www.zyvex.com; 2008; pp. 1-2.

* cited by examiner

*Primary Examiner*—Ha Tran T Nguyen
*Assistant Examiner*—Arleen M Vazquez
(74) *Attorney, Agent, or Firm*—Ditthavong, Mori & Steiner, P.C.

(57) ABSTRACT

Various methods and apparatus for electrically probe testing a semiconductor chip with circuit perturbation are disclosed. In one aspect, a method of testing is provided that includes contacting a first nano probe to a conductor structure on a first side of a semiconductor chip. The semiconductor chip has plural circuit structures. A external stimulus is applied to a selected portion of the first side of the semiconductor chip to perturb at least one of the plural circuit structures. The semiconductor chip is caused to perform a test pattern during the application of the external stimulus. An electrical characteristic of the semiconductor chip is sensed with the first nano probe during performance of the test pattern.

13 Claims, 4 Drawing Sheets

METHOD AND APPARATUS FOR NANO PROBING A SEMICONDUCTOR CHIP

BACKGROUND OF THE INVENTION

1. Field of the Invention

This invention relates generally to semiconductor processing, and more particularly to methods and apparatus for electrically probe testing a semiconductor chip.

2. Description of the Related Art

Soft defect isolation techniques are critical to the development and manufacture of large-scale integrated circuits such as processors. Examples of such techniques include those methodologies which exploit induced voltage alterations, such as Thermally Induced Voltage Alteration ("TIVA"), Light Induced Voltage Alteration ("LIVA") and Charge Induced Voltage Alteration ("CIVA"). The basic setup for these techniques uses a constant current source for biasing the device under inspection ("DUT") and a detector to sense the change in the voltage demand due to the localized heating, light stimulation by the laser or charge stimulation by an e-beam.

The aforementioned conventional stimulation/perturbation techniques can narrow the location of a soft defect down to perhaps a few square microns. To narrow down a defect location ever further and perhaps determine a particular cause of the soft defect, electrical probing is often used. In one conventional technique, a die is placed contact side up on a stage and several probe styluses are brought into contact with those contacts in the vicinity of the location of the soft defect determined by the stimulation/perturbation technique. The probe styluses are operable to sense electrical characteristics associated with the conductor structures, for example a voltage, a current or the presence or absence of continuity. Multiple areas are probed in this way in an attempt to identify a circuit structure that is clearly non-conforming.

One difficulty associated with the conventional stylus electrical probe system is that the differences in electrical behavior between a passing circuit structure and one which has a soft defect may be quite subtle. Indeed, the differences may be so small that they are washed out by noise levels in the testing apparatus. In this basic setup, no external stimulus is applied to the circuits undergoing probing that might cause a soft defect to stand out.

One conventional probe tester does incorporate a heated stage to apply thermal stimulation on a global basis to the backside of the chip while the contact side is electrically probed. The difficulty here is that the stimulation is applied to the backside of the chip and without the ability to focus on a particular location. This type of tester may not be able to resolve subtle soft defects.

The present invention is directed to overcoming or reducing the effects of one or more of the foregoing disadvantages.

SUMMARY OF THE INVENTION

In accordance with one aspect of the present invention, a method of testing is provided that includes contacting a first nano probe to a conductor structure on a first side of a semiconductor chip. The semiconductor chip has plural circuit structures. An external stimulus is applied to a selected portion of the first side of the semiconductor chip to perturb at least one of the plural circuit structures. The semiconductor chip is caused to perform a test pattern during the application of the external stimulus. An electrical characteristic of the semiconductor chip is sensed with the first nano probe during performance of the test pattern.

In accordance with another aspect of the present invention, a method of testing a semiconductor chip that has plural circuit structures is provided. A first of the plural circuit structures is tested by (1) contacting a nano probe to a conductor structure on a first side of the semiconductor chip, (2) applying an external stimulus to a selected portion of the first side of the semiconductor chip to perturb the first of the plural circuit structures, (3) causing the semiconductor chip to perform a test pattern during the application of the external stimulus, and (4) sensing an electrical characteristic of the first of the plural circuit structures with the first nano probe during performance of the test pattern, the sensed electrical characteristic defining a reference electrical characteristic. A second of the plural circuit structures is tested by (1) contacting a nano probe to a conductor structure on a first side of the semiconductor chip, (2) applying an external stimulus to a selected portion of the first side of the semiconductor chip to perturb the second of the plural circuit structures, (3) causing the semiconductor chip to perform a test pattern during the application of the external stimulus, and (4) sensing an electrical characteristic of the second of the plural circuit structures with the first nano probe during performance of the test pattern. The sensed electrical characteristic of the second of the plural circuit structures is compared with the reference electrical characteristic.

In accordance with another aspect of the present invention, an apparatus is provided that includes a member for holding a semiconductor chip that has a first side and plural circuit structures. A plurality of nano probes are provided for contacting selected portions of the first side of the semiconductor chip. At least one of the plurality of nano probes is being operable to sense an electrical characteristic of the at least one of the plural circuit structures. A stimulation source is operable to apply an external stimulus to selected portions of the first side of the semiconductor chip to selectively perturb at least some of the plural circuit structures.

In accordance with another aspect of the present invention, an apparatus is provided that includes a nano probe for probing selected portions of a semiconductor chip. The nano probe includes a stylus. An optical fiber is coupled to the stylus and is operable to deliver laser radiation in the direction of the stylus.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
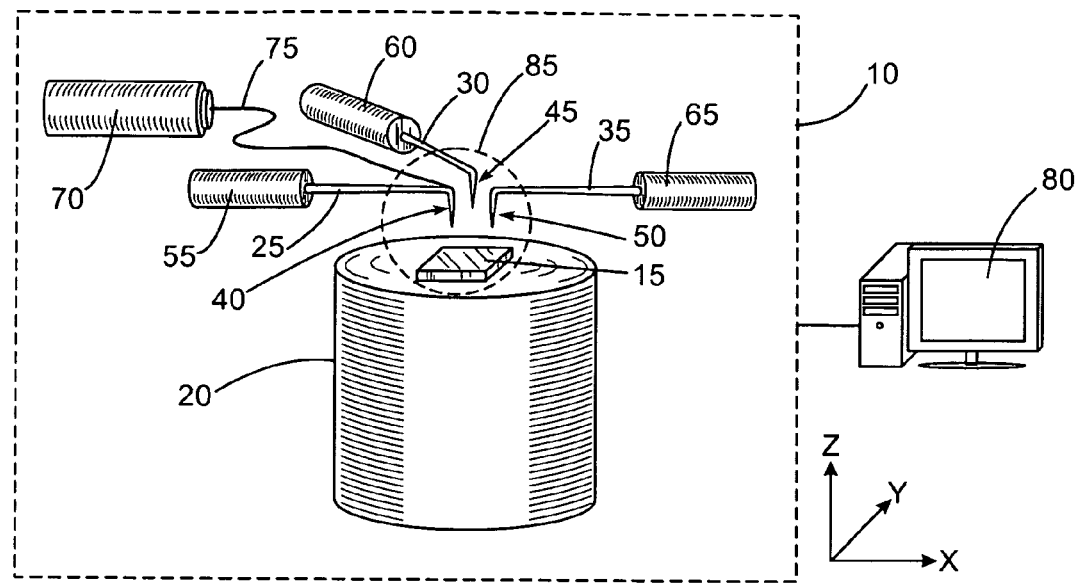
FIG. 1 is a pictorial view of an exemplary embodiment of an electrical probing system for electrically probing a semiconductor chip.

In the drawings described below, reference numerals are generally repeated where identical elements appear in more than one figure. Turning now to the drawings, and in particular to FIG. 1, therein is shown a pictorial view of an exemplary embodiment of an electrical probing system 10 that is suitable for electrically probing a semiconductor chip 15. The system 10 may include a member or stage 20 upon which the semiconductor chip 15 may be seated during testing as well as a plurality of probes, three of which are shown and labeled 25, 30 and 35. The number of probes 25, 30 and 35 in the system 10 may be varied. The probes 25, 30 and 35 include respective highly sharpened tips or styluses 40, 45 and 50 that are designed to make physical contact with selected portions of the semiconductor chip 15. The probes 25, 30 and 35 may be coupled to respective carrier structures 55, 60 and 65. The carrier structures 55, 60 and 65 may be stationary or operable to move along any of the X, Y or Z axes. Indeed to position the tips 40, 45 and 50 relative to selective positions on the semiconductor chip, either the stage 20 or the tips 25, 30 and 35 or both may be movable in the X, Y or Z axes. Single or multi-axis movement is possible. As described more fully below, the probes 25, 30 and 35 may be provided with a variety of capabilities, such as, electrical stimulation, laser stimulation and thermal stimulation. In this illustrative embodiment, a laser source 70 is provided to deliver laser radiation at wavelengths suitable to penetrate the chip and cause perturbations. An optical fiber 75 may be coupled to the laser source 70 and the probe 25.

The probe system 10 may be interfaced with a computer system 80 that may be operable to provide a variety of control and data acquisition functions. The computer system 80 may be a general purpose computer or a computing device specifically tailored for test pattern execution. For example, the computer system 80 may be operable to position the stage 20 and/or the probes 25, 30 and 35 in order to probe selected portions of the chip 15. In addition, the computer system 80 may be operable to interface electrically with the chip 15 via the probes 25, and 35 and thereby cause the chip 15 to execute certain test patterns or scripts during probe testing. In addition, the computer system 80 may be used to control the operation of the laser 70.

Figure 2:
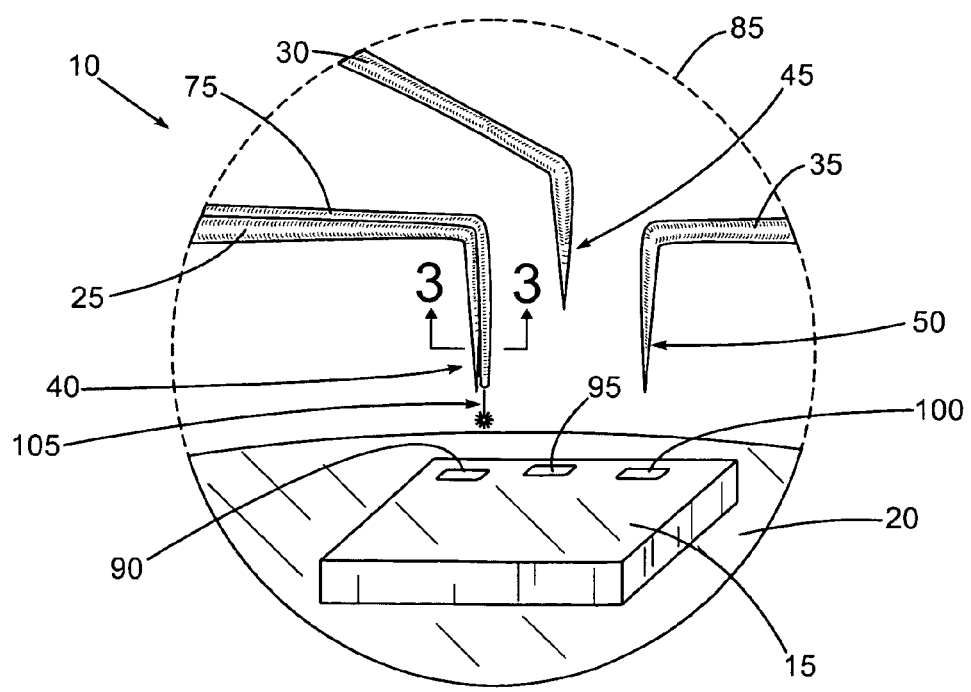
FIG. 2 is a magnified portion of FIG. 1.

Additional details regarding the probe system 10 may be understood by referring now also to FIG. 2, which is a magnified view of the portion of FIG. 1 circumscribed by the dashed circle 85. Note that only a small portion of the chip stage 20 as well as the probes 25, 30 and 35 and the optical fiber 75 are visible. The view associated with the dashed oval 85 will be used for two alternative embodiments depicted in FIGS. 5 and 6. Turning now to FIG. 2, the chip 15 has undergone a series of deprocessing steps to expose what would otherwise be buried conductor structures 90, 95 and 100. Such deprocessing normally entails material removable by lapping, etching or other material removal techniques. The semiconductor chip 15 may include millions of conductor structures suitable for probing. Examples includes device contacts, local interconnects, vias, metallization lines, larger blocks of circuitry, and I/O pads to name just a few. For simplicity of illustration, only three conductor structures 90, 95 and 100 are depicted, and at a much larger scale relative to the chip 15 than will usually be seen in actual practice.

The function of the exemplary probe system 10 is to simultaneously electrically probe and cause localized perturbations in selected portions of the semiconductor chip 15 the chip 15 by way of laser and/or thermal stimulation. In this illustrative embodiment, the probe 25 may be configured as an electrical probe structure. The probe 30 may be configured as either an electrical or a thermal stimulation structure. In this regard, the probe 30 may be connected to a heat source of one form or another. Further, the probe 35 may be configured as either an electrical or a thermal probe like the probe 30. To provide for localized laser stimulation, the probe 25 may be fitted with the optical fiber 75 so that laser radiation 105 may be delivered to selected portions of the chip 15. In operation, the stylus 40 of the probe 25 is brought into contact with, for example, the contact structure 90, and the laser 70 depicted in FIG. 1 is activated to deliver the laser radiation 105 to an area proximate the contact structure 90 and then simultaneously one or more test patterns are run in the chip 15 by way of the computer system 80 depicted in FIG. 1. The laser radiation 105 will cause a localized perturbation that will yield a signal and/or processing anomaly if there is a soft defect present in the illuminated portion.

Figure 3:
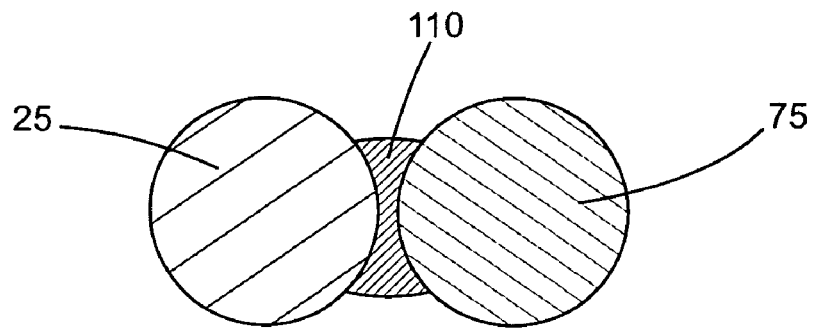
FIG. 3 is a sectional view of FIG. 2 taken at section 3-3.

Attention is now turned to FIG. 3, which is a sectional view of FIG. 2 taken at section 3-3. The optical fiber 75 may be connected to the probe 25 by way of an adhesive 110. The adhesive 110 may be, for example, Duco® cement. Other types of fasteners, such as tapes or clips may be used in lieu of, or in addition to the adhesive 110.

Figure 4:
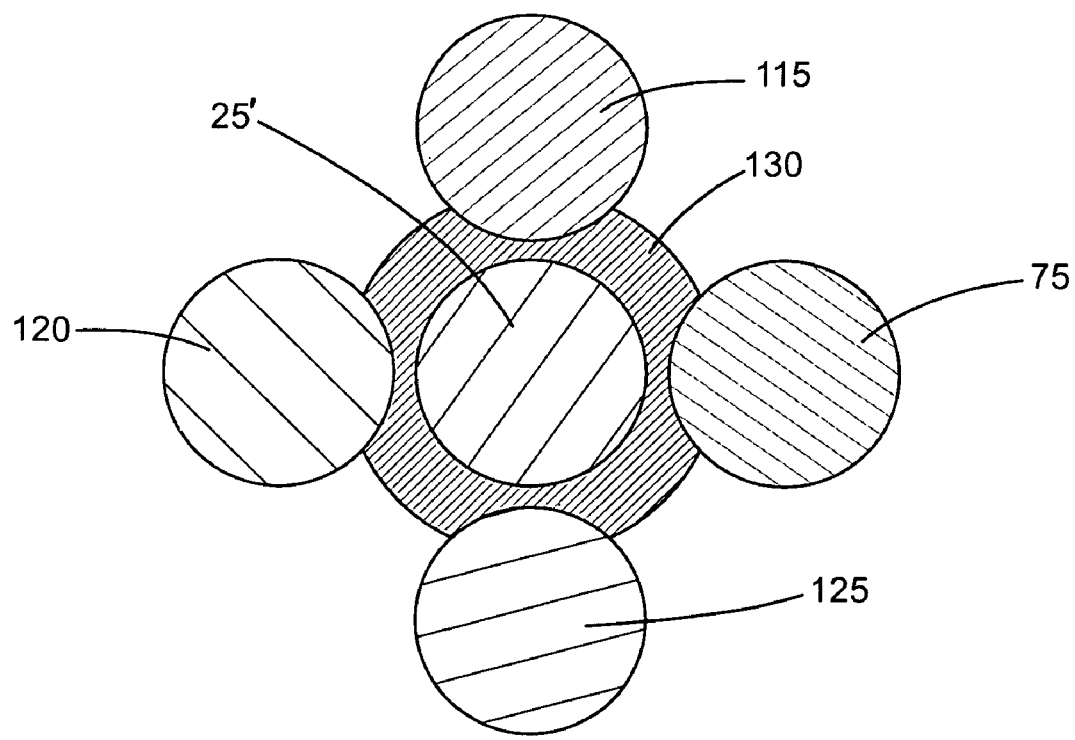
FIG. 4 is a sectional view like FIG. 3 but of an alternate exemplary embodiment of a probe stylus and optical fiber arrangement.

In an alternate exemplary embodiment depicted in FIG. 4, a probe 25' may be provided with more than a single optical fiber, in this case four such fibers 75, 115, 120 and 125 that are spaced around the periphery of the probe 25' and secured thereto by an adhesive 130 or by the other fastening techniques described herein before. In this multiple optical fiber arrangement, several different locations surrounding the probe 25' and thus the point on the chip 15 contacted by the probe 25' may be perturbated by laser radiation to provide for a better coverage and perhaps faster location of specific soft defects. The skilled artisan will appreciate that the number and spacing of the individual optical fibers 75, 115, 120 and 125 may be varied between one and a large number such that the fibers begin to take on the shape of a fiber optic bundle.

Figure 5:
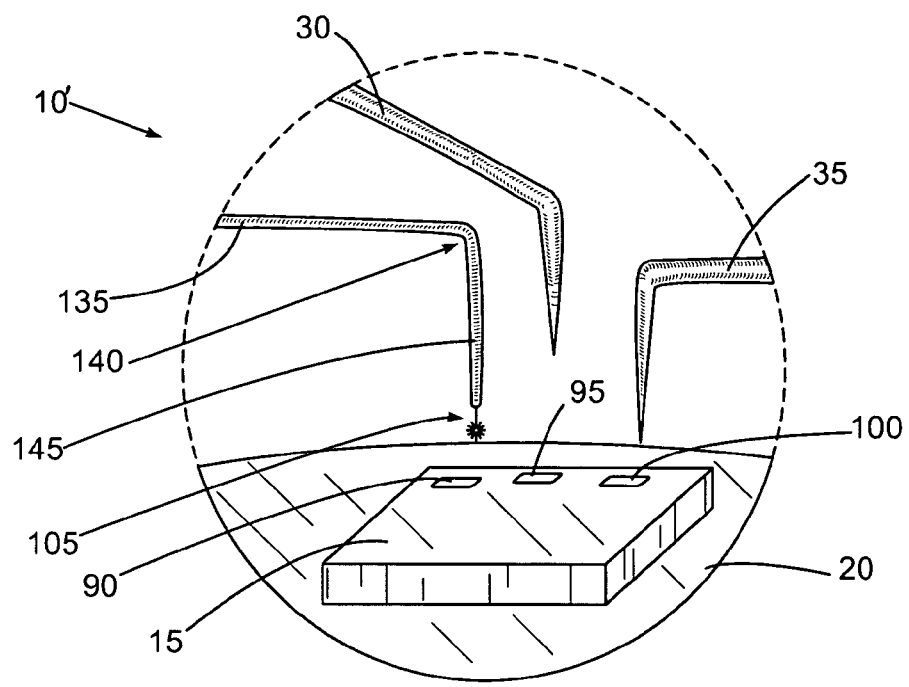
FIG. 5 is a view like FIG. 2 but of an alternate exemplary embodiment of an electrical probing system.

An alternate exemplary embodiment of a probe system 10' may be understood by referring now to FIG. 5. In this illustrative embodiment, the chip 15 and in particular the contact structures 90, 95 and 100 thereof may be electrically probed by the probes 30 and 35. However, laser stimulation may be provided by a laser optical fiber 135 that is not tethered to an electrical probe as is the case in the embodiment of FIGS. 1 and 2. In this regard, the optical fiber 135 may be configured as a bent fiber that has a bend 140 that yields a downwardly projecting portion 145 that is operable to emit laser radiation 105 for purposes of causing localized perturbations in the semiconductor chip 15. Again, the probes 30 and 35 may be configured as electrical or thermal probe tips as desired and described elsewhere herein. Furthermore, the fiber 135, the probes 30 and 35 and the chip stage 20 may all be movable as described generally above with regard to the embodiment disclosed in FIGS. 1 and 2.

Figure 6:
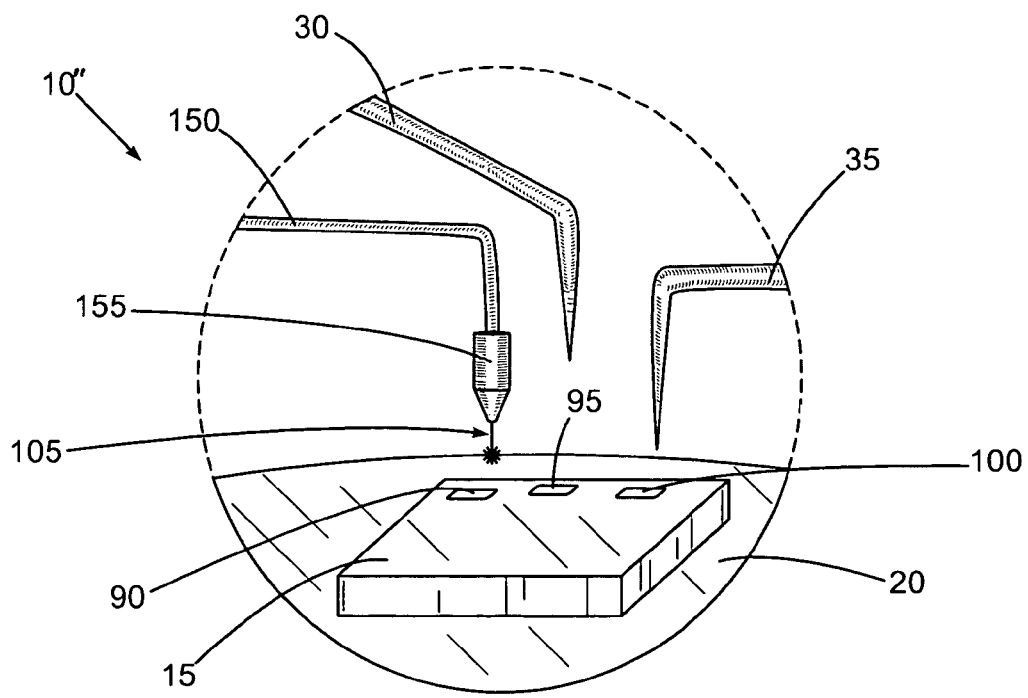
FIG. 6 is a view like FIG. 5 of another alternate exemplary embodiment of an electrical probing system.

Another alternate exemplary embodiment of a probe system 10" may be understood by referring now to FIG. 6. In this embodiment, the semiconductor chip 15 is again positioned on the chip stage 20. Probes 30 and 35 are included as generally described elsewhere herein. An optical fiber 150 is provided for delivering laser radiation 105 to selected portions of the chip 15 while, for example, the contact pads 90, 95 and 100 are contacted by the probes 30 and/or 35. However, in this embodiment the optical fiber 150 may be provided with an aperture 155 that is operable to provide a near field effect for the laser radiation 105 so that near field stimulation at sub-wavelength resolution may be obtained for the laser radiation. Like all the other embodiments disclosed herein, the probes 30 and 35 and the fiber 150 as well as the chip stage 20 may be movable to facilitate the positioning of the fiber 150 and the probes 30 and 35 relative to selected portions of the chip 15.

For any of the embodiments disclosed herein, a variety of wavelengths may be used for the perturbations. For example, a 1.0 micron wavelength corresponds to the bandgap for electron hole pair formation in the silicon. If thermal excitation only is desired, a wavelength below the electron hole pair creating bandgap may be used, such as 1.32 microns. The probes 25, 25', 30 and 35 of any of the disclosed embodiments may be composed of well-known conducting materials suitable for probe tips, such as, for example, tungsten, beryllium-copper, or the like. Carbon nanotubes could also be used. Wear resistance is a desirable property. Similarly, the optical fibers 75 and 150 may be composed of various types of well-known silica that are suitable for optical fibers.

Figure 7:
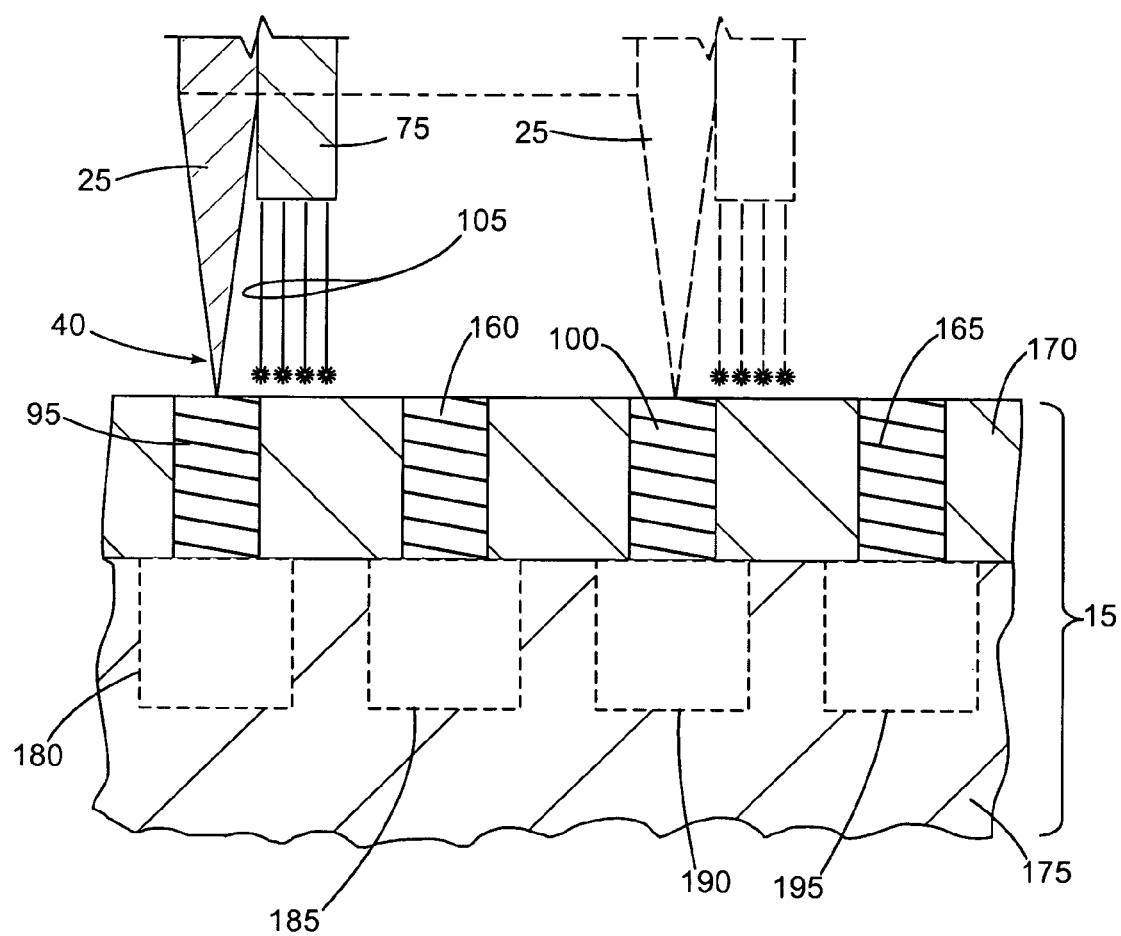
FIG. 7 is sectional view of a portion of a semiconductor chip undergoing probe testing in accordance with an exemplary method disclosed herein.

An exemplary testing method may be understood by referring now to FIG. 7, which is a sectional view of a small portion of the semiconductor chip 15 depicted in FIGS. 1 and 2 that incorporates the conductor structures 95 and 100 as well as two additional similar conductor structures 160 and 165. The contacts 95, 100, 160 and 165 are surrounded laterally by an electrically insulating layer 170 that may be a single or a series of laminated multiple insulating layers. For example, the layer 170 may consist of an interlevel dielectric layer that is routinely used at the contact level for a semiconductor device. The portion of the chip 15 labeled 175 may consist of an active semiconductor region in which four circuit structures are represented schematically by the dashed boxes 180, 185, 190 and 195. The circuit structures 180, 185, 190 and 195 may be virtually any type of circuit structure that is used in a semiconductor device, such as, for example, a transistor gate, a transistor impurity region such as a source/drain or collector/emitter region, a capacitor structure, some larger block of circuitry, or even portions of another metallization layer in the event that the chip 15 is deprocessed down to a metallization layer but not down to a device contact layer. In this illustration, the contact structure 95 is electrically connected with the circuit device 180, the contact structure 165 is electrically connected to the circuit device 190 and the contact structures 160 and 165 are in respective electrical contact with the circuit structures 185 and 190. The probe 25 and the accompanying optic fiber 75 may be positioned relative to the contact structure 95 using the techniques disclosed elsewhere herein such that the stylus 40 establishes electrical contact with the contact structure 95. At this point, the laser 70 depicted in FIG. 1 may be activated so that the optic fiber 75 emits the laser radiation to cause a perturbation in the portion of the chip 15 proximate the circuit structure 180 while the chip 15 is forced to execute one or more scripts or test patterns. The test patterns may exercise many aspects of the chip 15. Examples include a read/write operation for a cache memory cell, an operation of a logic gate, and the switching of an individual device, such as a transistor, to name just a few. A voltage or current pulse or set of such pulses may be used force the executions. Following the probing of the circuit structure 180, the probe 25 may then be moved to another position, for example, proximate the contact 100 that is connected to the circuit structure 190 and the process repeated.

The electrical behavior differences between a circuit structure with a soft defect and one without may be quite subtle. It will useful therefore to develop a metric by which to identify a soft defect. Either the circuit structure 180 or the circuit structure 190, depending on the electrical behavior during the test patterns, may serve as a reference circuit structure that provides a known set of passing electrical functionality so that comparison may be made to other circuit structures the chip 15 for purposes of determining whether or not a soft defect is associated with a particular location. For example, the probe 25 may sense an electrical characteristic, such as voltage, current, timing, resistance or the like, of the circuit structure 180 and that sensed electrical characteristic is used as a reference for comparison with a sensed electrical characteristic of the circuit structure 100 and so on. The same procedures would apply if a probe capable of thermal stimulation as opposed to laser stimulation were used at various locations on the chip 15. If a laser source separate from a probe, such as the optical fiber 150 depicted in FIG. 5, is used, then stimulation and probing are performed by separate parts.

Virtually any type of semiconductor chip may be tested using the techniques disclosed herein, such as microprocessors, graphics processors, combined microprocessor/graphics processors, memory devices, application specific integrated circuits or the like. Such devices may be multiple core and multiple dice.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of testing a semiconductor chip having plural circuit structures, comprising: testing a first of the plural circuit structures by (1) contacting with a first nano probe to a conductor structure on a first side of the semiconductor chip, (2) applying an external stimulus to a selected portion of the first side of the semiconductor chip to perturb the first of the plural circuit structures, (3) causing the semiconductor chip to perform a test pattern during the application of the external stimulus, and (4) sensing an electrical characteristic of the first of the plural circuit structures with the first nano probe during performance of the test pattern, the sensed electrical characteristic defining a reference electrical characteristic; testing a second of the plural circuit structures by (1) contacting with the first nano probe another conductor structure on a first side of the semiconductor chip, (2) applying an external stimulus to a selected portion of the first side of the semiconductor chip to perturb the second of the plural circuit structures, (3) causing the semiconductor chip to perform a test pattern during the application of the external stimulus, and (4) sensing an electrical characteristic of the second of the plural circuit structures with the first nano probe during performance of the test pattern; and comparing the sensed electrical characteristic of the second of the plural circuit structures with the reference electrical characteristic.

2. The method of claim 1, wherein the applying an external stimulus comprises illuminating the selected portion with laser radiation.

3. The method of claim 2, wherein the laser radiation is supplied by an optical fiber.

4. The method of claim 3, wherein the optical fiber is coupled to the first nano probe.

5. The method of claim 1, wherein the applying an external stimulus comprises applying heat to the selected portion of the first side.

6. The method of claim 5, wherein the applying heat is performed by contacting another nano probe to the semiconductor chip.

7. An apparatus, comprising: a member for holding a semiconductor chip having a first side and plural circuit structures; a plurality of nano probes for contacting selected portions of the first side of the semiconductor chip, at least one of the plurality of nano probes being operable to sense an electrical characteristic of the at least one of the plural circuit structures; a stimulation source operable to apply an external stimulus to selected portions of the first side of the semiconductor chip to selectively perturb at least some of the plural circuit structures; wherein the apparatus is configured to perform a test pattern during application of the external stimulus to a selected portion and to sense an electrical characteristic of a first circuit structure by using the at least one of the nano probes to define a reference electrical characteristic; to perform a test pattern during application of the external stimulus to another selected portion and to sense an electrical characteristic of a second circuit structure by using the at least one of the nano probes; and to compare the sensed electrical characteristic of the second circuit structure with the reference electrical characteristic.

8. The apparatus of claim 7, wherein the stimulation source comprises a laser source.

9. The apparatus of claim 8, wherein the laser source comprises an optical fiber.

10. The apparatus of claim 9, wherein the optical fiber is coupled to one of the plurality of nano probes.

11. The apparatus of claim 7, wherein the stimulation source comprises a heat source.

12. The apparatus of claim 11, wherein the heat source comprises one of the plurality of nano probes.

13. The apparatus of claim 7, a computer system electrically coupled to the semiconductor chip to cause the semiconductor chip to perform a test pattern during application of external stimulus by the stimulation source.

* * * * *